US012794191B2

(12) United States Patent
Yang et al.

(10) Patent No.: US 12,794,191 B2
(45) Date of Patent: Nov. 10, 2026

(54) HIGH-POWER, MULTI-CHANNEL AMPLIFIER FIBER LASER FOR MEDICAL APPLICATIONS

(71) Applicant: Boston Scientific Scimed Inc., Maple Grove, MN (US)

(72) Inventors: Baocheng Yang, Fremont, CA (US); Jian Zhang, Lancaster, MA (US); Steven Yihlih Peng, Fremont, CA (US); Michael O'Brien, Hudson, MA (US); Rongwei Jason Xuan, Fremont, CA (US); Thomas Charles Hasenberg, Campbell, CA (US)

(73) Assignee: Boston Scientific Scimed, Inc., Maple Grove, MN (US)

( * ) Notice: Subject to any disclaimer, the term of this patent is extended or adjusted under 35 U.S.C. 154(b) by 712 days.

(21) Appl. No.: 18/185,216

(22) Filed: Mar. 16, 2023

(65) Prior Publication Data

US 2023/0378708 A1 Nov. 23, 2023

Related U.S. Application Data

(60) Provisional application No. 63/269,435, filed on Mar. 16, 2022.

(51) Int. Cl.

*H01S 3/067* (2006.01)
*H01S 3/0933* (2006.01)

(Continued)

(52) U.S. Cl.

CPC ........ *H01S 3/06758* (2013.01); *H01S 3/0675* (2013.01); *H01S 3/06762* (2013.01);

(Continued)

(58) Field of Classification Search

CPC ............. H01S 3/0675; H01S 3/094053; H01S 3/094076; H01S 3/10084; H01S 3/10092; H01S 3/1616; H01S 3/2383

See application file for complete search history.

(56) References Cited

U.S. PATENT DOCUMENTS 4,959,837 A * 9/1990 Fevrier .............. H01S 3/06708 359/341.1
4,963,832 A * 10/1990 Desurvire ........... H04B 10/291 359/341.41

(Continued)

FOREIGN PATENT DOCUMENTS

CN 106848816 B 12/2019
WO 2020204839 A1 10/2020

OTHER PUBLICATIONS

Pal, "Continuous-wave and quasi-continuous wave thulium-doped all-fiber laser: implementation on kidney stone fragmentations," 2016, Applied Optics, vol. 55, No. 23, p. 6151-6155. (Year: 2016).*

(Continued)

*Primary Examiner* — Michael Carter

(74) *Attorney, Agent, or Firm* — Seager, Tufte & Wickhem, LLP

(57) ABSTRACT

The techniques described herein relate to a laser system, including: a plurality of fiber laser amplifiers; a beam combiner configured to combine laser light outputs from the plurality of fiber laser amplifiers; an optical delivery fiber configured to receive the combined output from the plurality of laser amplifiers into the delivery fiber and configured to deliver the combined output to a target; one or more diode lasers configured for providing optical pump pulses to the plurality of fiber laser amplifiers, wherein the laser light outputs from the plurality of fiber laser amplifiers are generated in response to the provided optical pump pulses.

16 Claims, 8 Drawing Sheets

(51) Int. Cl.

| | |
|---|---|
| ***H01S 3/094*** | (2006.01) |
| ***H01S 3/10*** | (2006.01) |
| ***H01S 3/16*** | (2006.01) |
| ***H01S 3/23*** | (2006.01) |
| ***H01S 5/042*** | (2006.01) |

(52) U.S. Cl.
CPC ...... *H01S 3/0933* (2013.01); *H01S 3/094053* (2013.01); *H01S 3/094076* (2013.01); *H01S 3/10092* (2013.01); *H01S 3/1616* (2013.01); *H01S 3/2383* (2013.01); *H01S 5/0428* (2013.01)

(56) References Cited

U.S. PATENT DOCUMENTS

| | | | | |
|---|---|---|---|---|
| 5,042,039 | A * | 8/1991 | Edagawa ............ | H01S 3/06708 372/71 |
| 5,387,211 | A | 2/1995 | Saadatmanesh et al. | |
| 6,212,310 | B1 | 4/2001 | Waarts et al. | |
| 8,094,370 | B2 * | 1/2012 | Lewis ................ | G02B 6/03688 359/341.1 |
| 2010/0044106 | A1 | 2/2010 | Zediker et al. | |
| 2012/0269217 | A1 | 10/2012 | Senda | |
| 2017/0325890 | A1 | 11/2017 | Chia et al. | |
| 2018/0092693 | A1 * | 4/2018 | Falkenstein ........... | H01S 3/1024 |
| 2018/0102621 | A1 * | 4/2018 | Shi, I ...................... | H01S 3/067 |
| 2020/0222118 | A1 | 7/2020 | Yu et al. | |
| 2021/0257801 | A1 * | 8/2021 | Sakamoto ........... | H01S 5/06825 |
| 2023/0119153 | A1 * | 4/2023 | Di Teodoro .......... | H01S 3/0675 372/6 |

OTHER PUBLICATIONS

International Search Report and Written Opinion dated Aug. 3, 2023 for International Application No. PCT/US2023/064580.

Gaida et al., "Coherent combination of two Tm-doped fiber amplifiers," Optics Letters, Optical Society of America, 40(10): 2301-2304, May 15, 2015.

Pal et al., "Continuous-wave and quasi-continuous wave thulium-doped all-fiber laser: implementation on kidney stone fragmentations," Applied Optics, Optical Society of America, 55(23): 6151-6155, Aug. 10, 2016.

Shah et al., "High-Power spectral beam combining of linearly polarized Tm:fiber lasers," Applied Optics, Optical Society of America, 54(4): 757-762, Feb. 1, 2015.

Fried et al., "Advances in Laser Technology and Fibre-Optic Delivery Systems in Lithotripsy," Nature Reviews, Urology Nature Publishing Group, US. vol. 15, No. 9, pp. 563-573. Jun. 8, 2018.

Hardy et al., "Fragmentation and Dusting of Large Kidney Stones using Compact, Air Cooled, High Peak Power 1940-nm, Thulium Fiber Laser," Progress in Biomedical Optics and Imaging SPIE-International Society for Optical Engineering, Bellingham, WA, US, vol. 10468, 5 Pages. Feb. 7, 2018.

* cited by examiner

HIGH-POWER, MULTI-CHANNEL AMPLIFIER FIBER LASER FOR MEDICAL APPLICATIONS

CROSS REFERENCE TO RELATED APPLICATIONS

This application claims the benefit of U.S. Provisional Patent Application Ser. No. 63/269,435 filed on Mar. 16, 2022, the disclosure of which is incorporated herein by reference.

TECHNICAL FIELD

This disclosure generally relates to fiber lasers and, in particular, to high-power, multi-channel amplifier fiber lasers for medical applications.

BACKGROUND

In medical applications, laser energy is used in many procedures, such as, for example, incision, excision, resection, vaporization, ablation, fragmentation, coagulation, hemostasis, denaturalization, etc. of various body tissues. In laser lithotripsy, laser energy is used to disintegrate stones in the urinary tract of a subject. In some applications, laser lithotripsy may be performed using a Chromium ($Cr3+$), Thulium ($Tm3+$), Holmium ($Ho3+$) triple doped yttrium aluminum garnet (CTH:YAG, or in short Ho:YAG) laser system, which are solid-state, lamp-pumped, pulsed lasers that emits light having a wavelength of about 2.1 μm. Light emitted from a Ho:YAG laser provides a relatively high fragmentation efficiency for different types of stones, but such lasers are expensive, cumbersome, and have low wall-plug efficiencies (i.e., the ratio of laser light energy emitted by the laser to the electrical energy required to generate the laser light energy).

In some medical applications, fiber lasers can be used to provide therapeutic laser light to a subject, but while the wall-plug efficiency of fiber lasers generally is higher than that lasers, fiber lasers often cannot attain the output power achievable by a Ho:YAG and therefore may be unsuitable for certain procedures that require high-power laser light.

In addition, while high-power laser light may lead to relatively fast ablation and fragmentation of stones, this may also result in relatively large stone fragments that may need to be extracted from the subject using medical devices such as retrieval baskets. In some cases, lithotripsy using high-power laser pulses may also cause undesirable retropulsion of the stone fragments, which may complicate the retrieval of the fragments as the fragments are pushed away from the end of an optical fiber that delivers the laser energy to the stone.

Thus, a need exists to address the deficiencies of existing lasers used in medical procedures.

SUMMARY

In some aspects, the techniques described herein relate to a laser system, including: a plurality of fiber laser amplifiers; a beam combiner configured to combine laser light outputs from the plurality of fiber laser amplifiers; an optical delivery fiber configured to receive the combined output from the plurality of laser amplifiers into the delivery fiber and configured to deliver the combined output to a target; one or more diode lasers configured for providing optical pump pulses to the plurality of fiber laser amplifiers, wherein the laser light outputs from the plurality of fiber laser amplifiers are generated in response to the provided optical pump pulses.

In some aspects, the techniques described herein relate to a laser system, wherein the fiber laser amplifiers each include a Tm-doped gain section.

In some aspects, the techniques described herein relate to a laser system, wherein the one or more diode lasers includes a plurality of diode lasers, each of which is configured to generate optical pump pulses, the laser system further including: a first pump combiner configured for combining the generated optical pump pulses from a first set of the plurality of diode lasers into a first optical fiber that provides the combined optical pump pulses from the first set of diode lasers to a gain section of a first one of the fiber laser amplifiers; and a second pump combiner configured for combining the generated optical pump pulses from a second set of the plurality of diode lasers into a second optical fiber that provides the combined optical pump pulses from the second set of diode lasers to a gain section of a second one of the fiber laser amplifiers.

In some aspects, the techniques described herein relate to a laser system, wherein each of the first and second pump combiners includes a plurality of pigtailed optical fibers that are tapered into a single multi-mode optical fiber, each of the pigtailed optical fibers being configured for receiving light pulses from one of the plurality of diode lasers and providing the received light pulses into the single multi-mode optical fiber.

In some aspects, the techniques described herein relate to a laser system or claim 2, wherein the one or more diode lasers includes a master oscillator configured for providing optical pump pulses to the plurality of fiber laser amplifiers, and wherein the laser light outputs from the plurality of fiber laser amplifiers are generated in response to the provided optical pump pulses.

In some aspects, the techniques described herein relate to a laser system, further including: a beam splitter configured to split an output of optical pump pulses from the master oscillator into different optical fibers configured to provide the optical pump pulses to the different fiber laser amplifiers.

In some aspects, the techniques described herein relate to a laser system, wherein the combined laser output delivered to the target has a power of greater than 1.0 kW.

In some aspects, the techniques described herein relate to a laser system, wherein the laser output delivered to the target has a wavelength between 1925 nm and 2100 nm.

In some aspects, the techniques described herein relate to a laser system, wherein each of the fiber laser amplifiers includes a resonator formed between an input coupler and an output coupler.

In some aspects, the techniques described herein relate to a laser system, further including: one or more power supplies configured to provide a plurality of temporally spaced-apart electrical pulses to the one or more diode lasers, wherein the one or more diode lasers are configured to emit laser light pulses in response to the provided electrical pulses, wherein the plurality of temporally spaced-apart electrical pulses include (a) one or more first electrical pulses configured to cause one or more of the diode lasers to emit laser light pulses provided to gain sections of the fiber laser amplifiers to excite a lasing medium of the gain sections to an energy level below a lasing threshold of the lasing medium, and (b) a plurality of second electrical pulses following the one or more first electrical pulses configured to cause the one or more diode lasers to emit laser light pulses provided to the gain sections of the fiber laser amplifiers to excite the lasing medium of the gain sections to an energy level above a lasing threshold of the lasing medium, and wherein each fiber laser amplifier is configured to output a quasi-continuous laser pulse in response to the plurality of second electrical pulses provided to the diode lasers.

In some aspects, the techniques described herein relate to a laser system, wherein each temporally spaced-apart electrical pulse has a duration in a range of 10 μs to 1000 μs.

In some aspects, the techniques described herein relate to a laser system, wherein a spacing between adjacent the temporally spaced-apart electrical pulses is between 10-300 μs.

In some aspects, the techniques described herein relate to a laser system, wherein a laser pulse duration of the quasi-continuous laser pulses is between 250 μs to 10 ms.

In some aspects, the techniques described herein relate to a laser system, wherein the quasi-continuous laser pulses include a plurality of temporally spaced apart laser pulses having a frequency greater than or equal to 1 kHz.

In some aspects, the techniques described herein relate to a laser system, wherein the plurality of fiber laser amplifiers includes at least four fiber laser amplifiers.

In some aspects, the techniques described herein relate to a laser system, including: a plurality of fiber laser resonators; a beam combiner configured to combine laser light outputs from the plurality of fiber laser resonators; an optical delivery fiber configured to receive the combined output from the plurality of laser resonators into the delivery fiber and configured to deliver the combined output to a target; a plurality of diode lasers configured for providing optical pump pulses to the plurality of fiber laser resonators, wherein the laser light outputs from the plurality of fiber laser resonators are generated in response to the provided optical pump pulses.

In some aspects, the techniques described herein relate to a laser system, wherein the fiber laser resonators each include a Tm-doped gain section.

In some aspects, the techniques described herein relate to a laser system, wherein each of the plurality of diode lasers is configured to generate optical pump pulses, the laser system further including: a first pump combiner configured for combining the generated optical pump pulses from a first set of the plurality of diode lasers into a first optical fiber that provides the combined optical pump pulses from the first set of diode lasers to a gain section of a first one of the fiber laser resonators; and a second pump combiner configured for combining the generated optical pump pulses from a second set of the plurality of diode lasers into a second optical fiber that provides the combined optical pump pulses from the second set of diode lasers to a gain section of a second one of the fiber laser resonators.

In some aspects, the techniques described herein relate to a laser system, wherein each of the first and second pump combiners include a plurality of pigtailed optical fibers that are tapered into a single multi-mode optical fiber, each of the pigtailed optical fibers being configured for receiving light pulses from one of the plurality of diode lasers and providing the received light pulses into the single multi-mode optical fiber.

In some aspects, the techniques described herein relate to a laser system, wherein the combined laser output delivered to the target has a power of greater than 1.0 kW and wherein the laser output delivered to the target has a wavelength between 1925 nm and 2100 nm.

In some aspects, the techniques described herein relate to a laser system, further including: one or more power supplies configured to provide a plurality of temporally spaced-apart electrical pulses to the plurality of diode lasers, wherein the diode lasers are configured to emit laser light pulses in response to the provided electrical pulses, wherein the plurality of temporally spaced-apart electrical pulses include (a) one or more first electrical pulses configured to cause one or more of the diode lasers to emit laser light pulses provided to gain sections of the fiber laser resonators to excite a lasing medium of the gain sections to an energy level below a lasing threshold of the lasing medium, and (b) a plurality of second electrical pulses following the one or more first electrical pulses configured to cause the one or more diode lasers to emit laser light pulses provided to the gain sections of the fiber laser resonators to excite the lasing medium of the gain sections to an energy level above a lasing threshold of the lasing medium, and wherein each fiber laser resonator is configured to output a quasi-continuous laser pulse in response to the plurality of second electrical pulses provided to the diode lasers.

In some aspects, the techniques described herein relate to a system, wherein each temporally spaced-apart electrical pulse has a duration in a range of 10 μs to 1000 μs.

In some aspects, the techniques described herein relate to a system, wherein a spacing between adjacent the temporally spaced-apart electrical pulses is between 10-300 μs.

In some aspects, the techniques described herein relate to a system, wherein a laser pulse duration of the quasi-continuous laser pulses is between 250 μs to 10 ms.

In some aspects, the techniques described herein relate to a system, wherein the quasi-continuous laser pulses include a plurality of temporally spaced apart laser pulses having a frequency greater than or equal to 1 kHz.

In some aspects, the techniques described herein relate to a laser system, including: a plurality of fiber laser amplifiers; a beam combiner configured to combine laser light outputs from the plurality of fiber laser amplifiers; an optical delivery fiber configured to receive the combined output from the plurality of laser amplifiers into the delivery fiber and configured to deliver the combined output to a target; a master oscillator configured for providing optical pump pulses to the plurality of fiber laser amplifiers, wherein the laser light outputs from the plurality of fiber laser amplifiers are generated in response to the provided optical pump pulses.

In some aspects, the techniques described herein relate to a laser system, wherein the fiber laser amplifiers each include a Tm-doped gain section, wherein the combined laser output delivered to the target has a power of greater than 1.0 kW, and wherein the laser output delivered to the target has a wavelength between 1925 nm and 2100 nm.

In some aspects, the techniques described herein relate to a laser system, further including: a beam splitter configured to split an output of optical pump pulses from the master oscillator into different optical fibers configured to provide the optical pump pulses to the different fiber laser amplifiers.

In some aspects, the techniques described herein relate to a laser system, wherein the master oscillator includes a diode laser.

In some aspects, the techniques described herein relate to a laser system, further including: one or more power supplies configured to provide a plurality of temporally spaced-apart electrical pulses to the master oscillator, wherein the master oscillator is configured to emit laser light pulses in response to the provided electrical pulses, wherein the plurality of temporally spaced-apart electrical pulses include (a) one or more first electrical pulses configured to the master oscillator to emit laser light pulses provided to gain sections of the fiber laser amplifiers to excite a lasing medium of the gain sections to an energy level below a lasing threshold of the lasing medium, and (b) a plurality of second electrical pulses following the one or more first electrical pulses configured to cause the master oscillator to emit laser light pulses provided to the gain sections of the fiber laser amplifiers to excite the lasing medium of the gain sections to an energy level above a lasing threshold of the lasing medium, and wherein each fiber laser amplifier is configured to output a quasi-continuous laser pulse in response to the plurality of second electrical pulses provided to the master oscillator.

In some aspects, the techniques described herein relate to a laser system, wherein each temporally spaced-apart electrical pulse has a duration in a range of 10 μs to 1000 μs.

In some aspects, the techniques described herein relate to a laser system, wherein a spacing between adjacent the temporally spaced-apart electrical pulses is between 10-300 μs.

In some aspects, the techniques described herein relate to a laser system, wherein a laser pulse duration of the quasi-continuous laser pulses is between 250 μs to 10 ms.

In some aspects, the techniques described herein relate to a laser system, wherein the quasi-continuous laser pulses include a plurality of temporally spaced apart laser pulses having a frequency greater than or equal to 1 kHz.

In some aspects, the techniques described herein relate to a laser system, wherein the plurality of fiber laser amplifiers includes at least four fiber laser amplifiers.

DETAILED DESCRIPTION

This disclosure relates to high-power fiber lasers and their use in medical procedures. In some implementations, light from multiple fiber lasers can be combined into a single delivery fiber that delivers the combined laser light from the multiple fiber lasers to the target. In some implementations, the fiber lasers can be pumped with seed pulse signals that are tailored to create temporally long laser pulses (e.g., quasi-continuous wave (QCW) laser light) for delivery to the target. In some implementations, multiple fibers lasers can be configured in a master oscillator power amplifier (MOPA) configuration, in which seed pulses injected into different fiber amplifiers are generated from a common master oscillator.

Figure 1:
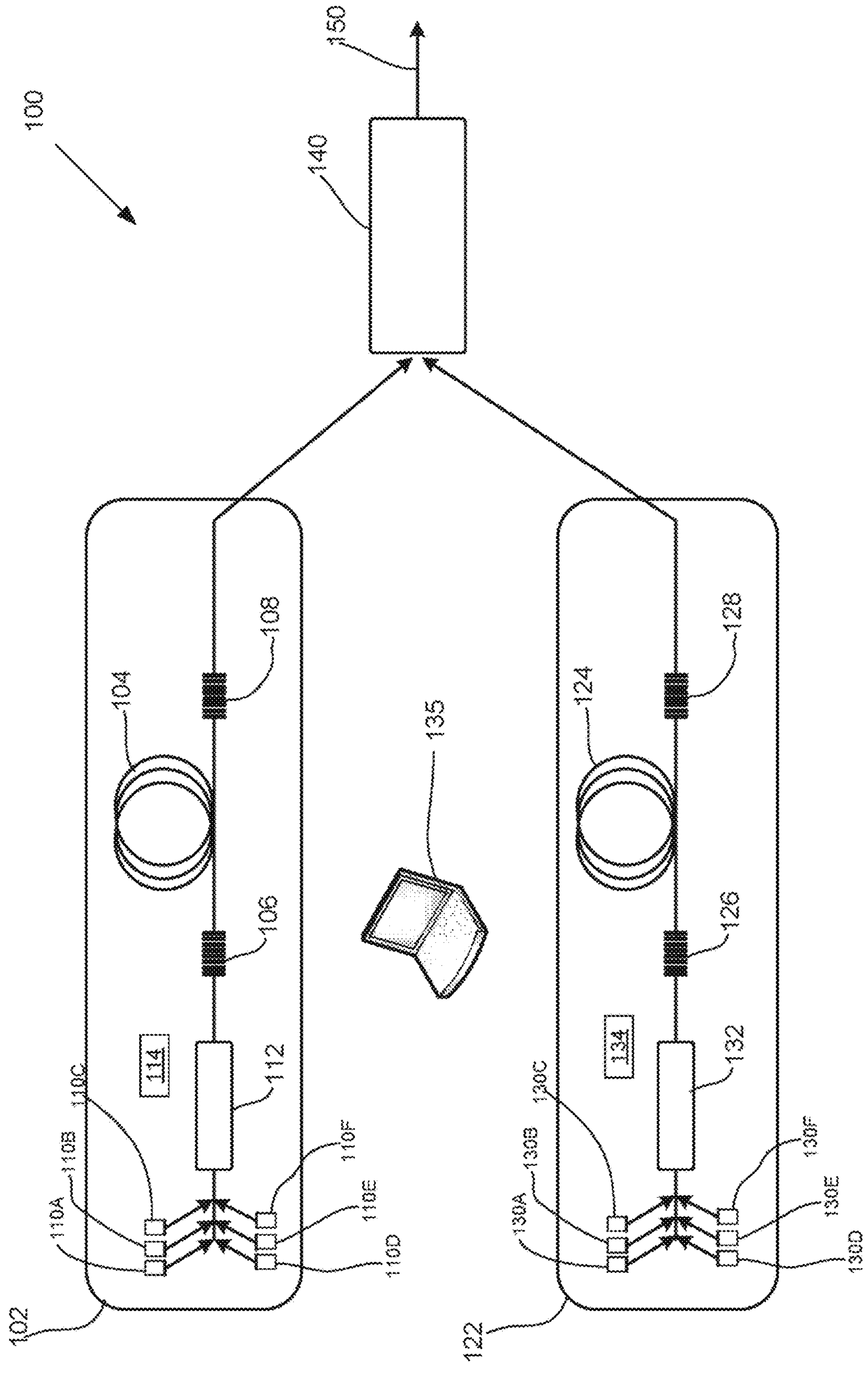
FIG. 1 is a schematic that of a laser system that includes a plurality of fiber lasers, the output of which can be combined and coupled into a single delivery optical fiber for delivering laser energy to a target.

FIG. 1 is a schematic that of a laser system 100 that includes a plurality of fiber lasers 102, 122, the output of which can be combined and coupled into a single delivery optical fiber for delivering laser energy to a target. Although to fiber lasers 102, 122 are shown in FIG. 1, combining the output of more than two (e.g., 3 to 8) fiber lasers into a single delivery optical fiber are contemplated in some implementations. The target can be on or in the body of a subject (e.g., a patient). For example, in some implementations, the target can be a kidney stone in a urinary tract of a patient, and the laser system 100 can be part of a lithotripsy therapy system configured to deliver laser energy to the stone to break up the stone within the patient so that the stone can be removed from the patient. By combining the output of two or more fiber lasers into a single delivery optical fiber, sufficient optical power (e.g., greater than 1.0 kW) to effectively disintegrate kidney stones in a subject in a lithotripsy procedure can be achieved in the delivery optical fiber, while also maintaining the optical power in each of the fiber lasers 102, 122 below a practical threshold power level to avoid damage to the fiber lasers, such that their longevity is not compromised.

Each of the fiber lasers 102, 122 can include a single- or double-clad optical fiber that transmits light within the core of the fiber along the length of the fiber. In some implementations, the delivery optical fiber can have a core diameter within a range of about 200 μm to about 300 μm and a numerical aperture (NA) of greater than 0.2. In some implementations, the fiber lasers 102, 122 can have a core diameter of about 25 μm and an NA within a range of about 0.1 to about 0.2.

Each of the fiber lasers 102, 122 can include a gain section 104, 124, respectively, that is doped with material so that light propagating within the respective gain section 104, 124 is amplified as it propagates in the gain section. For example, the gain section can be doped with thulium to emit laser light having a wavelength of approximately 2000 nm; for example, it has a peak wavelength of between 1925 nm and 2100 nm. The gain section 104 of the fiber laser 102 can be located between a highly reflective (e.g., R>90%) input coupler 106 and a less reflective (e.g., R≈70%) output coupler 108, so that light reflected between the input coupler and the output coupler can be amplified in the gain section 104 of the fiber laser, and a portion of the amplified light can be extracted through the output coupler 108. Similarly, the fiber laser 122 can include an input coupler 126 and an output coupler 128, between which the gain section 124 can operate to amplify the light that is reflected between the input coupler 126 and the output coupler 128.

The gain sections 104, 124 of each of the fiber lasers 102, 122 can be provided with seed light pulses from one or more diode lasers. For example, the gain section 104 of fiber laser 102 can receive pump light from diode lasers 110A, 110B, 110C, 110D, 110E, 110F. Diode lasers 110A, 110B, 110C, 110D, 110E, 110F can emit light in response to electrical signals provided by one or more power supplies 114, 134 to the diode lasers. The power supplies 114, 134 may include a capacitor for energy storage and discharge and an inductor for pulse shaping and may be configured to deliver electrical pulses from the capacitor to power lasers 110A, 110B, 110C, 110D, 110E, 110F to emit light.

As described in more detail here, the electrical signals provided by the power supplies 114, 134 to the diode lasers can be controlled by one or more controllers 135 (e.g., a computer or a processor configured to execute coded instructions), such that the timing and amplitude of the electrical signals provided to the diode lasers result in pump light signals that, in turn, drive the gain media 104, 124 of the fiber lasers 102, 122, such that a desired train of laser pulses is emitted from the fiber lasers for coupling into a delivery optical fiber 150.

The output pulses of pump light from diode lasers 110A, 110B, 110C, 110D, 110E, 110F can be combined through a pump combiner 112 into the optical fiber of the fiber laser 102 for introduction into the resonator between the input coupler 106 and the output coupler 108. In some implementations, the diode lasers 110A, 110B, 110C, 110D, 110E, 110F can emit pulses of light having a wavelength of about 793 nm, which can stimulate the Tm-doped lasing medium in the gain sections 104, 124 of the fiber lasers 102, 122 to generate coherent pulses of amplified light having a wavelength of about 2000 nm.

For example, in some implementations, the output of each diode laser 110A, 110B, 110C, 110D, 110E, 110F can be coupled in free space through the use of lenses, mirrors, and beam splitters into a combined optical beam that then is coupled into the optical fiber of the fiber laser. For example, in some implementations, the output of each diode laser 110A, 110B, 110C, 110D, 110E, 110F can be coupled into a respective optical fiber, and then the light in the respective optical fibers can be combined into the optical fiber of the fiber laser.

Like the fiber laser 102, the gain section 124 of fiber laser 122 can receive pump light from diode lasers 130A, 130B, 130C, 130D, 130E, 130F. The output pulses of pump light from diode lasers 130A, 130B, 130C, 130D, 130E, 130F can be combined through a pump combiner 132 into the optical fiber of the fiber laser 102 for introduction into the resonator between the input coupler 126 and the output coupler 128.

For example, in some implementations, the output of each diode laser 130A, 130B, 130C, 130D, 130E, 130F can be coupled in free space through the use of lenses, mirrors, and beam splitters into a combined optical beam that then is coupled into the optical fiber of the fiber laser. For example, in some implementations, the output of each diode laser 130A, 130B, 130C, 130D, 130E, 130F can be coupled into a respective optical fiber, and then the light in the respective optical fibers can be combined into the optical fiber of the fiber laser.

Figure 2:
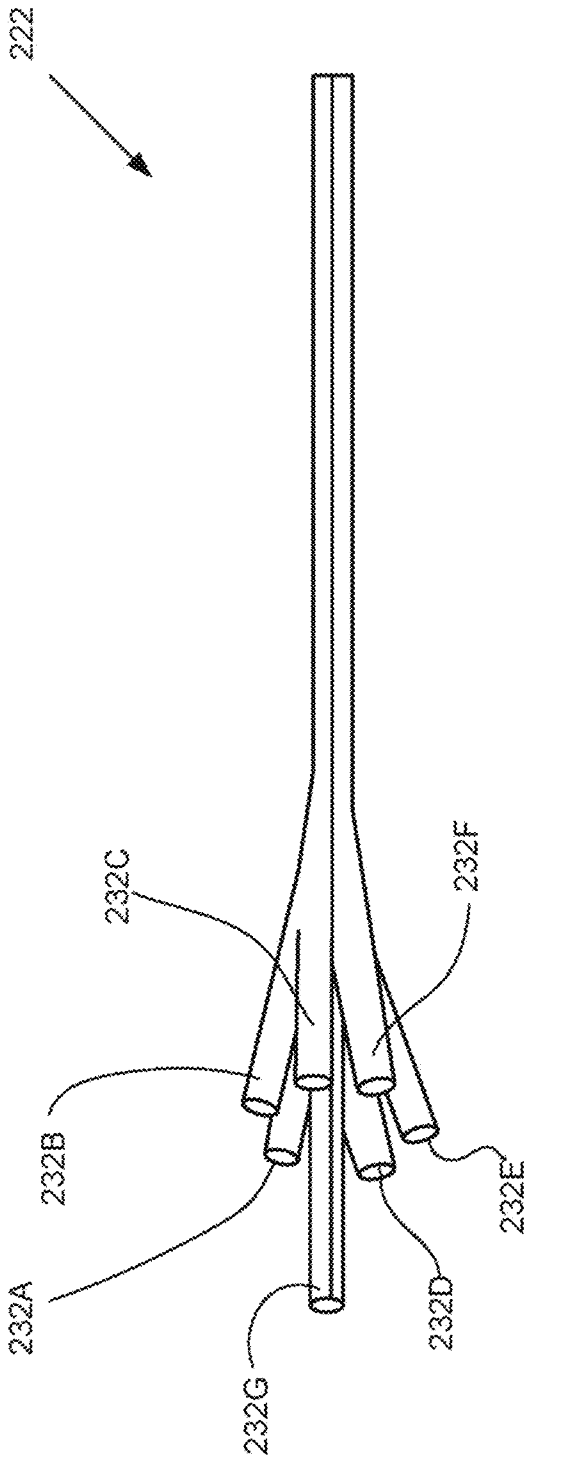
FIG. 2 is a schematic diagram of an example pump combiner in which light in different optical fibers from respective different diode lasers is combined into the optical fiber of the fiber laser.

FIG. 2 is a schematic diagram of an example pump combiner 222 in which light in different optical fibers from respective different diode lasers is combined into the optical fiber of the fiber laser. The pump combiner 222 includes multi-mode pigtail fibers 232A, 232B, 232C, 232D, 232E, 232F around a single-mode central fiber 232G. In some implementations, the pigtail fibers and the central fiber can have core diameters of about 105 μm an NA of about 0.15. The pigtail fibers and the central fiber can be tapered into an optical fiber that feeds light into the resonator of the fiber laser between the input coupler and the output coupler of the resonator. In some implementations, the optical fiber that fees light into the resonator can have an inner cladding diameter of about 125 μm an NA of about 0.45.

Referring again to FIG. 1, system 100 can include a signal combiner 140 located downstream from the fiber lasers 102, 122 and configured to combine laser light output from the different fiber lasers 102, 122 into a delivery optical fiber 150 for delivery to a target within or on a subject. In some implementations, the delivery optical fiber 150 can be a single-use fiber that can be coupled to the signal combiner 140 and used only once on a patient and then disposed of. In some implementations, the delivery optical fiber 150 can include a multi-mode fiber. In some implementations, the delivery optical fiber 150 can have a core diameter of less than 250 μm (e.g., about 242 μm) and an NA of about 0.28. As compared with higher core size fibers, the relatively small core size of the delivery fiber 150 can enable a relatively high degree of flexibility of a scope that contains the delivery fiber 150 and which is inserted into the body of a patient and/or a relatively high irrigation flow within the delivery fiber to the target site, and/or a smaller spot size of the laser light delivered to the target, resulting in smaller stone fragment sizes in a lithotripsy procedure.

In some implementation, the signal combiner 140 can include optical elements, such as, for example, one or more lenses, mirrors, and beam splitters configured to achieve free-space coupling of the laser light output from the fiber lasers 102, 122 into the delivery fiber 150. For example, lenses can be used to match the size and NA of an output beam to the core diameter and NA of the delivery fiber; mirrors can be used to direct the beams; and beam splitters, or partially-transmissive mirrors, can be used to combine a plurality of beams from different fiber lasers 102, 122 into a single propagation direction to couple the beams into the delivery fiber 150.

Figure 3:
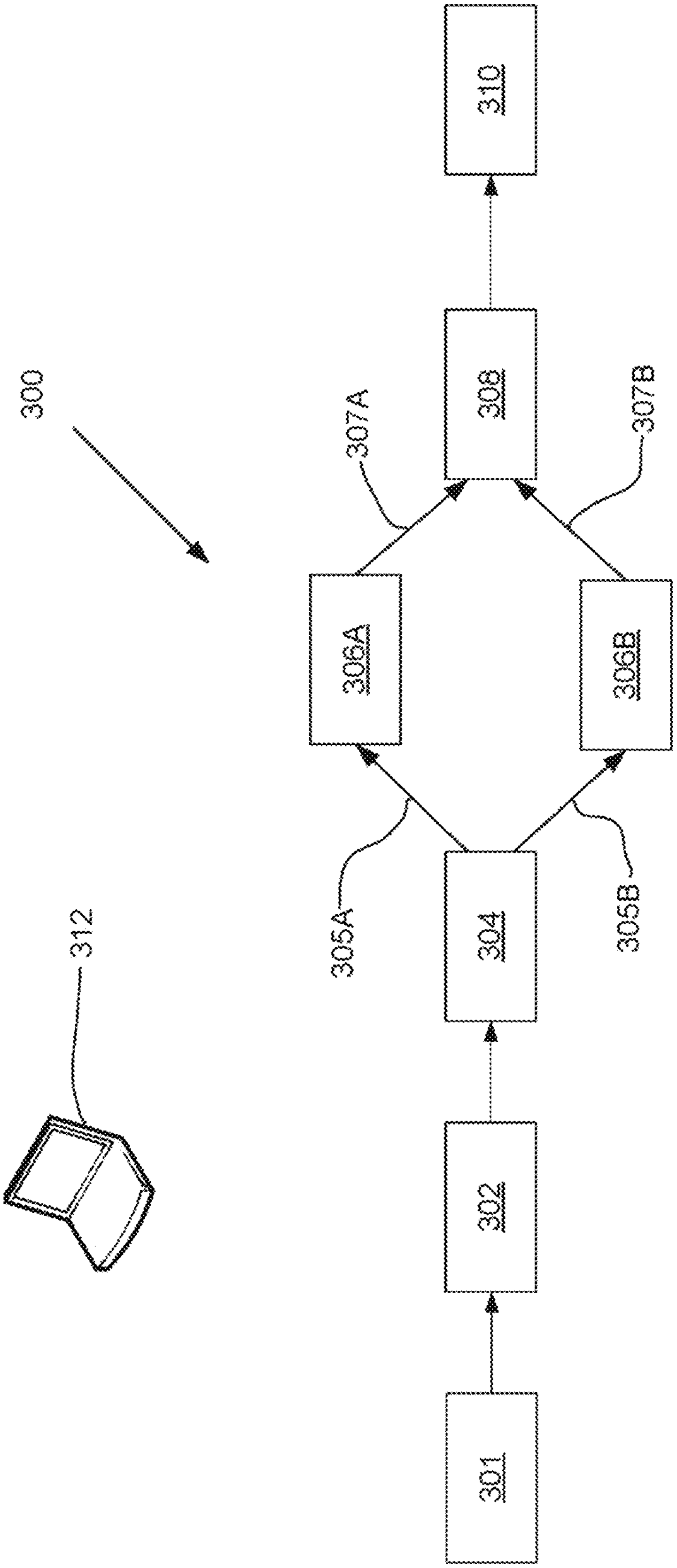
FIG. 3 is a schematic diagram of another implementation of a fiber laser system in which seed light pulses are generated by a master oscillator for stimulating laser emission of two or more fiber laser amplifiers.

FIG. 3 is a schematic diagram of another implementation of a fiber laser system 300 in which seed light pulses (e.g., 793 nm laser light) are generated by a master oscillator 302 for stimulating laser emission of two or more fiber laser amplifiers 306A, 306B (that include, for example, Tm-doped fibers). Although two fiber laser amplifiers 306A, 306B are shown in FIG. 3, more than two are contemplated, for example, three, four, five, six, seven, or eight fiber laser amplifiers. The generation of the seed pulses in the master oscillator 302 can be controlled by electrical signals provided to the master oscillator 302 by a power supply 301 that is controlled by a controller 312 (e.g., a computer or a processor configured to execute coded instructions). The power supply 301 may include a capacitor for energy storage and discharge and an inductor for pulse shaping and may be configured to deliver electrical pulses from the capacitor to power the master oscillator 302 to emit light.

The master oscillator 302 emits a temporal series of light pulses that are split by a beam splitter 304 into different propagation paths to seed the different fiber laser amplifiers 306A, 306B, and the seed pulses can be amplified in the amplifiers 306A, 306B as light propagates through the amplifier 306A, 306B, the output of which then can be combined by a beam combiner 308 for coupling into a delivery optical fiber 310.

The seed pulses can be provided from the beam splitter 304 to the different fiber laser amplifiers 306A, 306B in different optical fibers 305A, 305B, and the output of the fiber laser amplifiers 306A, 306B can be provided to the beam combiner 308 in different optical fibers 307A, 307B. In some implementations, the optical path lengths between the beam splitter 304 and the beam combiner 308 can be similar when traversing paths that include different fiber laser amplifiers 306A, 306B so that output pulses from the fiber laser amplifiers 306A, 306B arrive at the beam combiner 308 at times that would cause the output pulses to overlap in time downstream of the beam combiner. In this manner, the laser light energy from the plurality of fiber laser amplifiers 306A, 306B can be additively combined to produce relatively high-power, quasi-CW laser light in the delivery optical fiber 310 while maintaining the peak power in the fiber laser amplifiers 306A, 306B below a threshold power that could damage the fiber laser amplifiers 306A, 306B.

Referring again to FIG. 1, during operation of the system 100, controller 135 controls the power supplies 114, 134 to direct a current/voltage waveform, or an electrical pulse, having desired characteristics (amplitude, duration, magnitude, etc.) to the diode lasers 110A, 110B, 110C, 110D, 110E, 110F, 130A, 130B, 130C, 130D, 130E, 130F. In response to the electrical input from the power supplies 114, 134, diode lasers 110A, 110B, 110C, 110D, 110E, 110F, 130A, 130B, 130C, 130D, 130E, 130F generate optical energy that is coupled into the gain sections (or gain media) 104, 124 of the fiber laser 102, 122. The optical energy from the diode lasers raises the energy level of the electrons in the lasing medium gain sections 104, 124 to achieve a population inversion in which more of the electrons of the lasing gain sections 104, 124 are in their excited state than their ground state. Then, the stimulated emission of radiation having a wavelength corresponding to the difference in energy between the ground and excited states can lead to the amplification of light in the gain sections and the emission of pulses of laser light from gain sections 104, 124.

The characteristics (energy, pulse width, power, frequency, etc.) of the emitted laser pulses depend on the characteristics of the optical pulses generated by the diode lasers 110A, 110B, 110C, 110D, 110E, 110F, 130A, 130B, 130C, 130D, 130E, 130F, which, in turn, depend on the electrical pulses directed to the diode lasers 110A, 110B, 110C, 110D, 110E, 110F, 130A, 130B, 130C, 130D, 130E, 130F from the power supplies 114, 134.

Figure 4A:
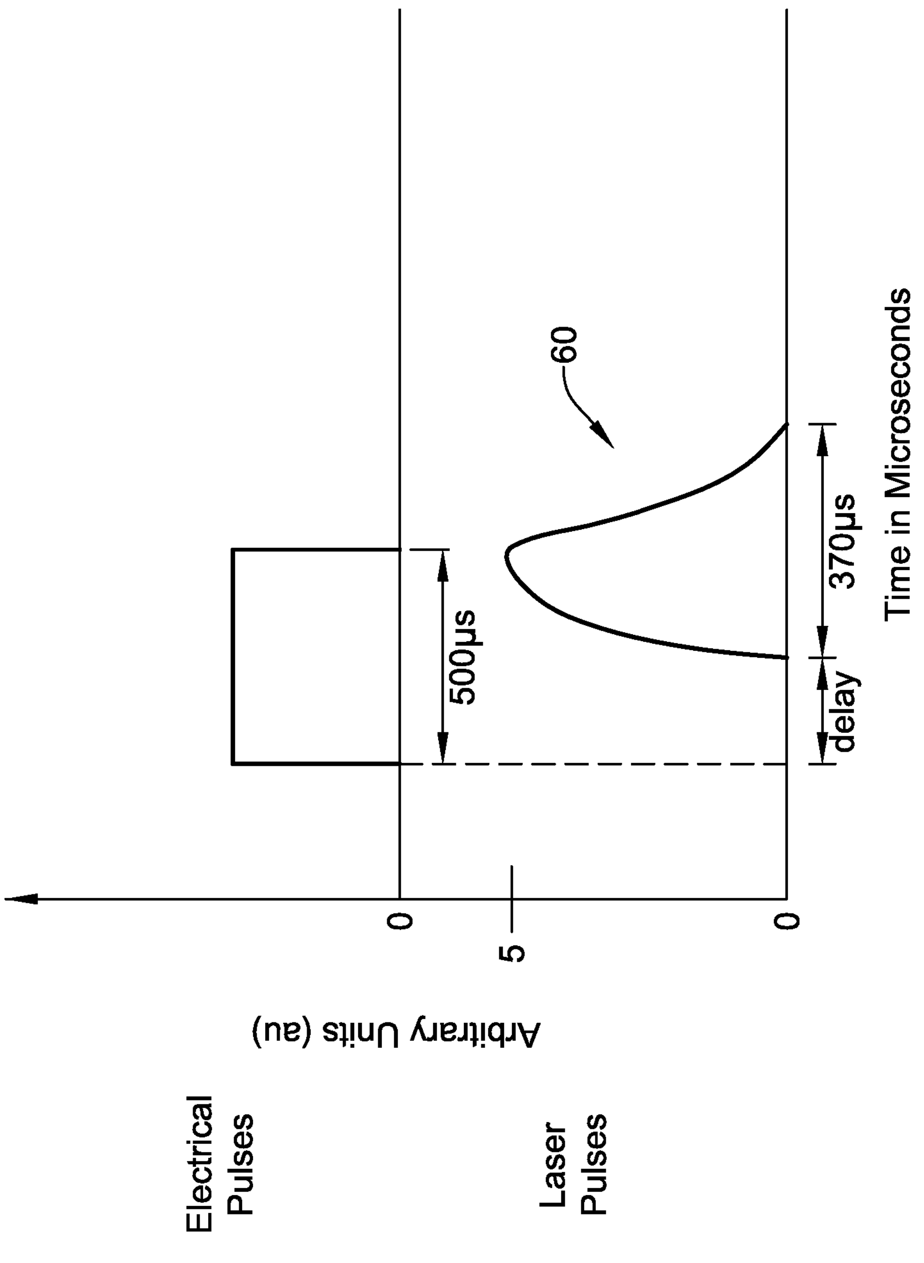
FIG. 4A illustrates a case when a relatively short electrical pulse is directed to a diode laser to generate light.
Figure 4B:
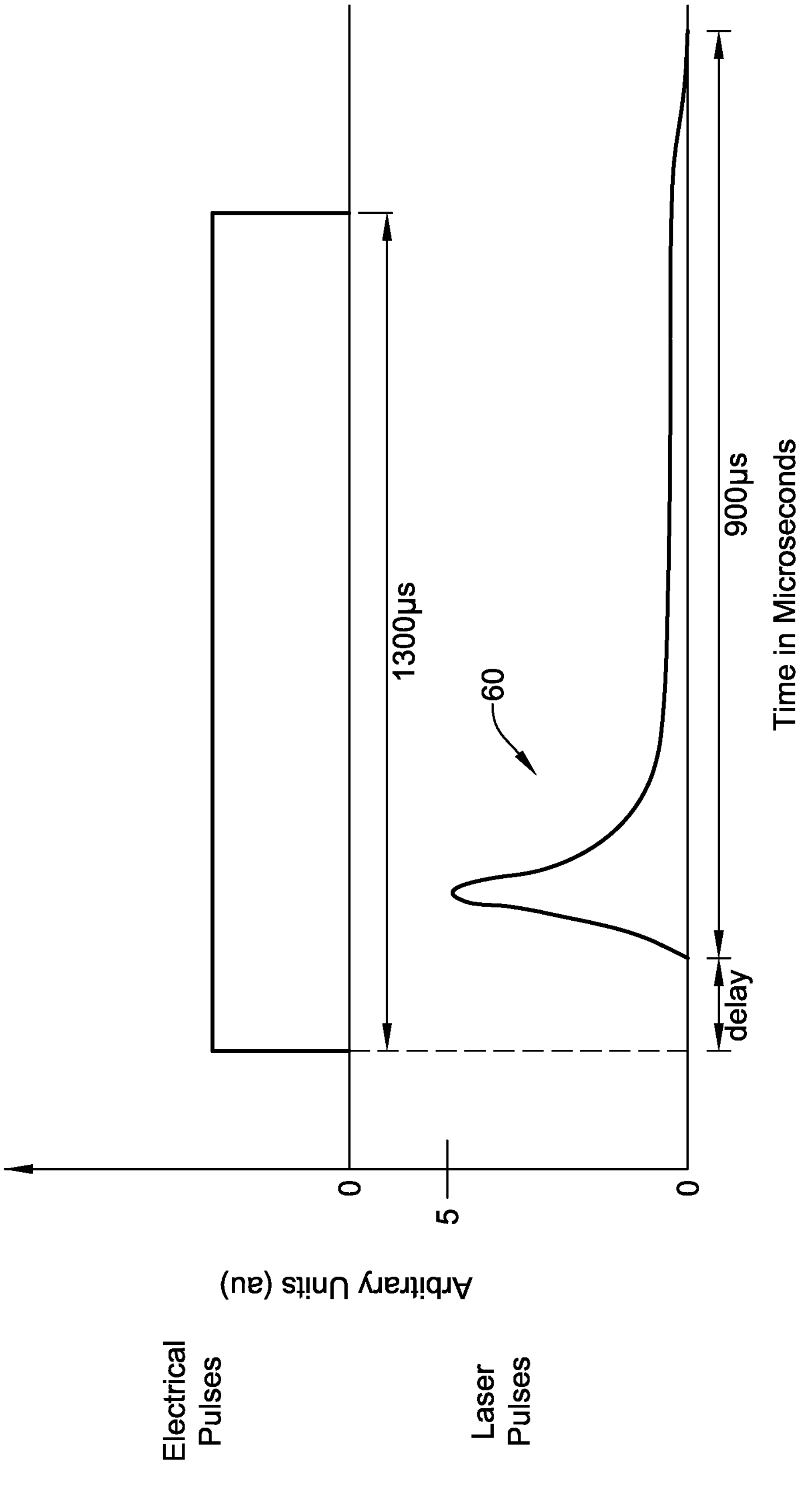
FIG. 4B illustrates the case when a relatively longer electrical pulse is directed to a diode laser to generate light.

FIGS. 4A and 4B are simplified charts that illustrate exemplary relationships between an electrical pulse to a diode lasers 110A, 110B, 110C, 110D, 110E, 110F, 130A, 130B, 130C, 130D, 130E, 130F, and the resulting laser pulse emitted from the gain section 104, 124 of a fiber laser 102, 122 in a standard operating mode. In these figures, the upper portion illustrates the electrical pulse directed to a diode lasers 110A, 110B, 110C, 110D, 110E, 110F, 130A, 130B, 130C, 130D, 130E, 130F, and the lower portion illustrates the resulting laser pulse. FIG. 4A illustrates the case when a relatively short electrical pulse is directed to a diode lasers 110A, 110B, 110C, 110D, 110E, 110F, 130A, 130B, 130C, 130D, 130E, 130F, and FIG. 4B illustrates the case when a relatively longer electrical pulse is directed to a diode laser.

Although the electrical pulses in FIGS. 4A and 4B are illustrated schematically as rectangular pulses, in practice, these pulses may have more rounded features because of losses in the components that generate the pulses. In contrast to such electrical pulses, the corresponding laser pulses 60 (in FIGS. 4A and 4B) have a characteristic shark-fin shape. That is, these laser pulses 60 have a high initial peak followed by a steep decline. The areas of the curves in FIGS. 4A and 4B are indicative of the energy of the corresponding laser pulse 60. As can be seen from both FIGS. 4A and 4B, a finite time delay ($t_{delay}$) exists between the start of an electrical pulse and the laser pulse 60 that results from the electrical pulse. This time delay is related to the time it takes for the lasing medium of the gain section 104, 124 to reach the lasing threshold. Simplistically, the energy of the electrical pulse in the time period $t_{delay}$ is used to raise the excitation level of the electrons in the lasing medium 22 to the lasing threshold, and when this threshold is reached or exceeded, a laser pulse is emitted from the gain section.

As seen in both FIGS. 4A and 4B, the emitted laser pulse 60 is temporally shorter than the electrical pulse that generates it. For example, in FIG. 4A, the electrical pulse has a duration of about 500 μs, and the laser pulse 60 that results from this electrical pulse is only about 370 μs, and in FIG. 4B, while the electrical pulse has a duration of about 1300 μs, the resulting laser pulse 60 has a duration of about 900 μs. This difference in duration is a result of the energy losses that occur in the gain section 104, 124 as well as due to reduction in fluorescence lifetime due to stronger pumping and thermal effects. Additionally, as seen by comparing FIGS. 4A and 4B, because of the rapidly decaying shape of the laser pulse curve, the increase in energy (area under the laser pulse curve) resulting from a longer electrical pulse is not substantial.

Conventionally, to increase the energy of the emitted laser pulse, the power (or magnitude) of the electrical pulse is increased. Increasing the power of the electrical pulse (and thereby the optical pumping energy from a diode laser 110A, 110B, 110C, 110D, 110E, 110F, 130A, 130B, 130C, 130D, 130E, 130F) increases the magnitude of the initial peak of the corresponding laser pulse. However, the higher magnitude initial peak resulting from a high-power electrical pulse may cause the energy of the laser pulse 60 to, at least momentarily, exceed a threshold value, which may damage optical components of the laser system 100. In addition, laser pulses having high peak powers supplied to a kidney stone target may cause undesirable effects such as retropulsion and large stone fragments (which may have to be removed using additional medical devices such as, for e.g., retrieval baskets).

For some stone fragmentation applications (e.g., "stone dusting" where small fragments of the stone are chipped away and removed by suction or naturally flushed from the patient's body), it may be desirable to increase the energy of a laser pulse 60 without causing a sharp energy spike in the initial peak region of the pulse. In some implementations, the energy of the laser pulse can be increased by increasing the duration of the laser pulse and decreasing the peak pumping energy that produces the laser pulse. For example, in some implementations, the controller 135 may control the power and duration of the electrical pulse such that the emitted laser pulse 60 has an energy density below a threshold energy density but is provided over a sufficiently long time to produce a desired therapeutic result.

Figure 5A:
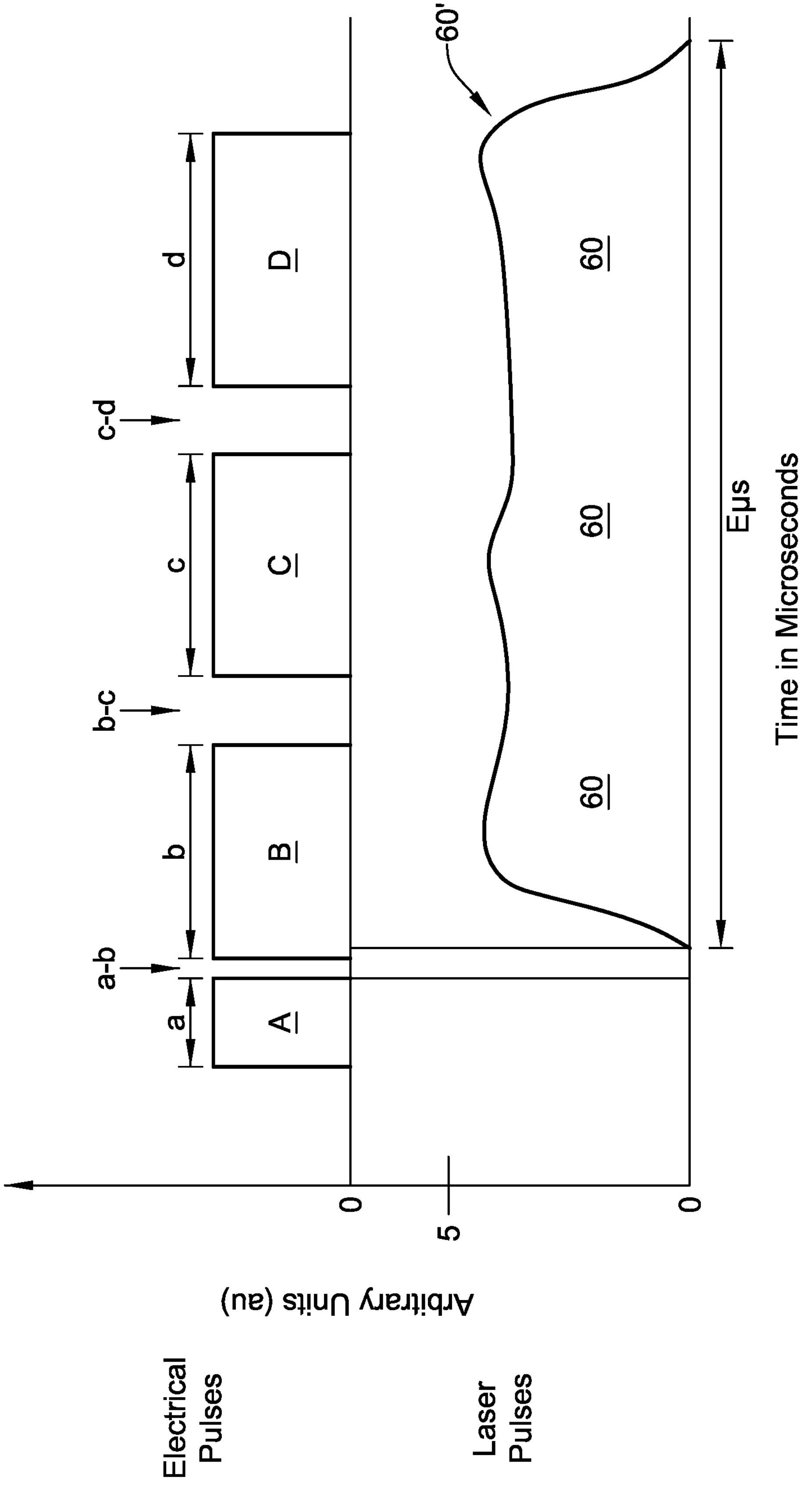
FIGS. 5A and 5B illustrate exemplary quasi-continuous laser pulses.

FIG. 5A is a simplified chart that illustrates a relationship between electrical pulses and the resulting laser. In this implementation, multiple temporally spaced-apart electrical pulses (marked A, B, C, D) are directed from a power supply 114, 134 to one or more diode lasers 110A, 110B, 110C, 110D, 110E, 110F, 130A, 130B, 130C, 130D, 130E, 130F such that the laser pulse resulting from these temporally spaced-apart electrical pulses and emitted from a fiber laser 102, 122 have a quasi-continuous waveform (quasi-continuous laser pulse 60'). With reference to FIG. 5A, in some implementations, the initial electrical pulse provided to the one or more diode lasers 110A, 110B, 110C, 110D, 110E, 110F, 130A, 130B, 130C, 130D, 130E, 130F may be a pre-pulse (marked A) that is configured to generate light from the one or more diode lasers 110A, 110B, 110C, 110D, 110E, 110F, 130A, 130B, 130C, 130D, 130E, 130F that raises the energy level of a gain section 104, 124 to a value that is close to, but just below, the lasing threshold (e.g., to about 80-99% of the lasing threshold) of the gain section. Pre-pulse A does not result in an emitted laser pulse 60 from a fiber laser 102, 122, because the excitation induced by the pre-pulse does not reach the lasing threshold. However, at the end of the pre-pulse A at time $t_1$, the electrons of the gain section 104, 124 may be primed to emit radiation in the form of a laser pulse 60 upon further addition of a small amount of energy. Then, a sequence of a plurality of electrical pulses (e.g., pulses B, C, D) is provided to one or more diode lasers 110A, 110B, 110C, 110D, 110E, 110F, 130A, 130B, 130C, 130D, 130E, 130F in a short interval to initiate the quasi-continuous laser pulse 60' from a fiber laser 102, 122. In general, the plurality of electrical pulses may be spaced apart such that a subsequent electrical pulse is within the fluorescence lifetime of its immediately preceding pulse (i.e., pulse B is within the fluorescence lifetime of pulse A, pulse C is within the fluorescence lifetime of pulse B, etc.).

In some implementations, as illustrated in FIG. 5A, the quasi-continuous laser pulse 60' that results from the spaced-apart electrical pulses A, B, C, D may be a continuous waveform having an extended duration of E μs. As used herein, a laser pulse having a continuous waveform is a laser pulse that may vary in magnitude from any maximum value to any non-zero minimum value during the duration of the pulse. That is, a continuous waveform has a magnitude of zero only at its terminal ends. In the implementation of FIG. 5A, the quasi-continuous laser pulse 60' is produced by merging (or combining) together individual laser pulses 60 produced by the individual electrical pulses B, C, and D. In some implementations, the laser pulses 60 produced by each electrical pulse of a set of spaced-apart electrical pulses may not be merged to produce a quasi-continuous laser pulse 60'. For example, in some implementations, a quasi-continuous laser pulse 60' may be produced by merging together only the laser pulses produced by electrical pulses B and C. If the pulse duration of a laser pulse produced by an individual electrical pulse (e.g., B and C) is 250 μm, the duration of a quasi-continuous laser pulse 60' may be more than 250 μm and less than 500 μm (produced, for example, by combining the laser pulses from the two electrical pulses).

As illustrated in FIG. 5A, after pre-pulse A, the further addition of a small amount of energy to the already primed lasing medium in a gain section 104, 124 results in the initiation of a quasi-continuous laser pulse 60' at time t2. The duration (a, b, c, d) of the electrical pulses, and the spacing (a-b, b-c, c-d) between them, may depend upon the characteristics of the laser system 100 and the power of the electrical pulses. In general, the duration a of the pre-pulse A may be such that the lasing medium in a gain section 104, 124 reaches an excitation level between about 80-99% (but below 100%) of the lasing threshold at the end of pre-pulse A, and the spacing a-b between pulses A and B, and B and C may be such that energy dissipation from the primed lasing medium in a gain section 104, 124 is minimized. Because a significant amount of energy remains stored in the lasing medium in a gain section 104, 124 at the end of each laser pulse (e.g., laser pulse 60 resulting from electrical pulse B) when a population inversion ceases to exist, if the spacing b-c between electrical pulses B and C is too high (but still within the fluorescence lifetime), this stored energy would be wasted in sub-threshold radiative and non-radiative decay prior to pumping by electrical pulse C. However, if electrical pulse C begins soon after electrical pulse B, much of the stored energy can be utilized in the generation of the next laser pulse 60, thereby decreasing the pump energy needed to achieve a population inversion. In some implementations, the duration of the electrical pulses can be from about 10 μs to about 1000 μs. In some implementations, the spacing between the electrical pulses can be from about 10 μs to about 300 μs.

Figure 5B:
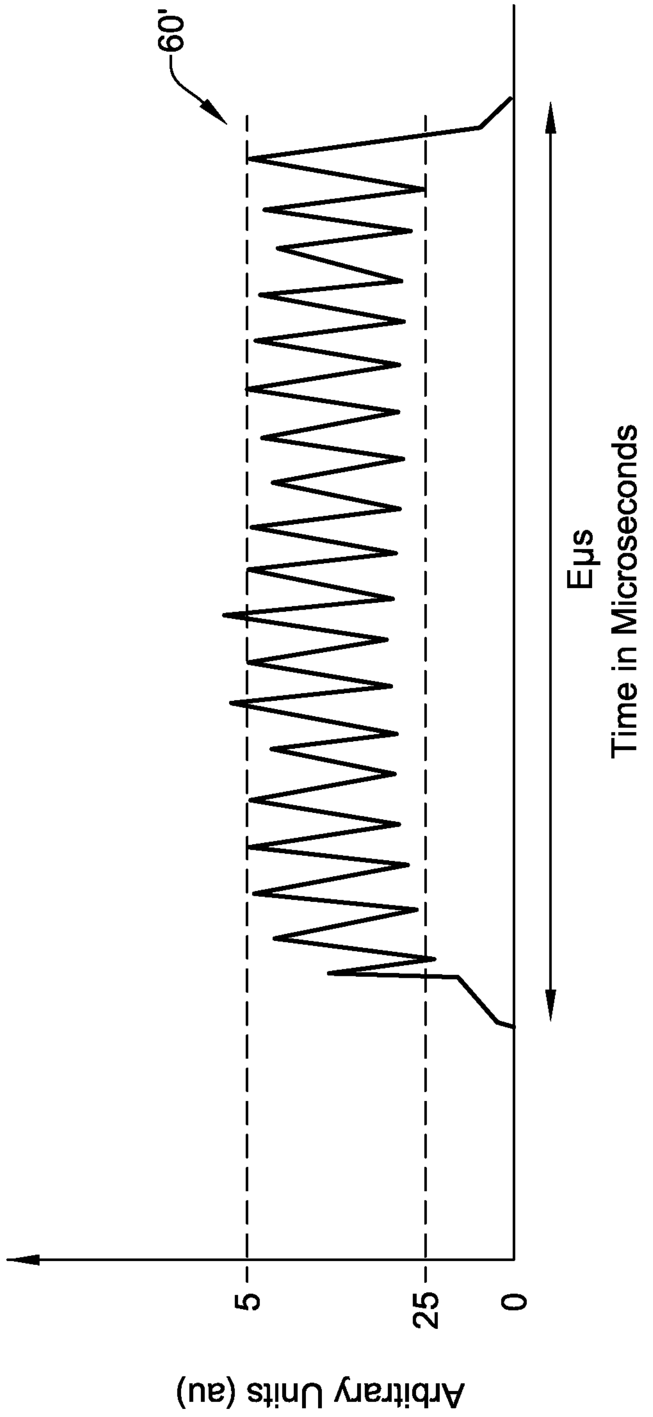

It should be noted that the illustrated shape in FIG. 5A of the quasi-continuous laser pulse 60' having a smooth continuous waveform is only exemplary. FIG. 5B illustrates another exemplary quasi-continuous laser pulse 60' having a continuous waveform that results from a plurality of temporally spaced-apart electrical pulses. As illustrated in FIG. 5B, the magnitude of the quasi-continuous laser pulse 60' may vary from an average maximum value of about 5 arbitrary units (au) to a minimum average value of about 1.25 au (i.e., 25% of the maximum value) in a duration of E μs. However, the waveform has a zero magnitude only at its terminal ends and has a non-zero magnitude everywhere within its duration. Although the magnitude of a continuous waveform between its terminal ends is always non-zero, it should be noted that the maximum and minimum values are illustrated in FIG. 5B are only exemplary. In general, the minimum value may be any percentage of the maximum value.

In FIGS. 5A and 5B, the laser pulses 60 resulting from each electrical pulse merge together to produce a quasi-continuous laser pulse 60' in the form of a continuous waveform. However, producing an output laser pulse of a continuous waveform is not a limitation, and in some implementations, the laser pulses 60 that result from the series of input electrical pulses may be temporally spaced apart. For example, with reference to FIG. 5A, if the spacing b-c and c-d between electrical pulses B, C, and D are less than or equal to a threshold value (e.g., 100 μs), the fiber laser 102, 122 may output a quasi-continuous laser pulse 60' in the form of a continuous waveform. However, if the electrical pulses B, C, and D are spaced apart greater than the threshold value, the fiber laser 102, 122 may output a quasi-continuous laser pulse 60' that includes distinct temporally spaced-apart laser pulses 60 (i.e., which collectively do not form a continuous waveform). However, because the frequency (and thereby the repetition rate) of these spaced-apart laser pulses 60 is greater than about 1 kHz (at room temperature), the resulting spaced-apart laser pulses 60 may resemble, and effectively be a substantially continuous laser pulse. Thus, in the current disclosure, the term quasi-continuous laser pulse is used to collectively refer to both (a) multiple laser pulses 60 merged together to form a laser pulse having a continuous waveform (e.g., similar to those illustrated in FIGS. 5A and 5B), and (b) multiple laser pulses 60 temporally spaced apart from each other with a frequency greater than about 1 kHz.

Figure 6:
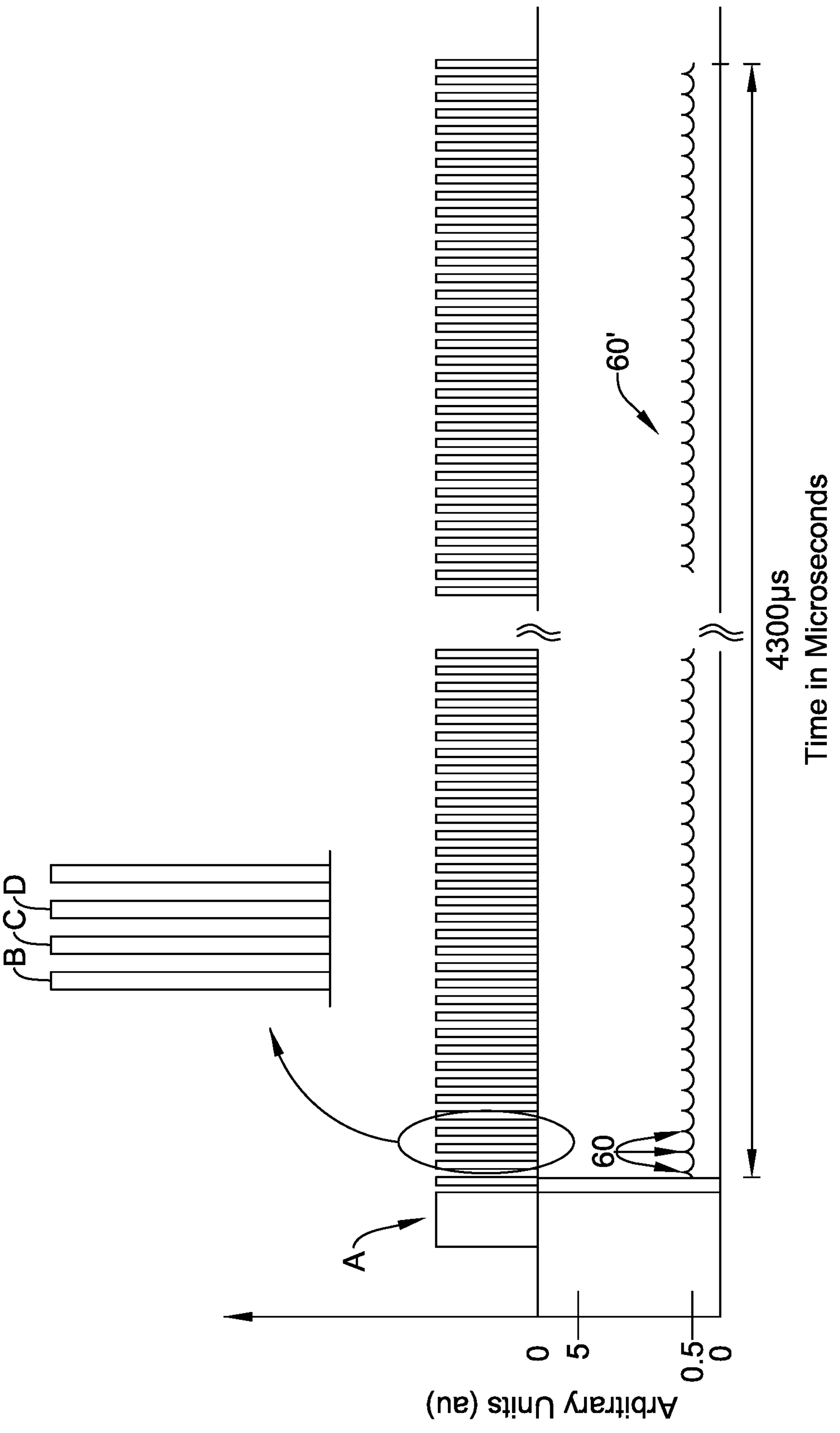
FIG. 6 is a simplified chart that illustrates another exemplary quasi-continuous laser pulse from a fiber laser in the form of a continuous waveform that results from a plurality of temporally spaced-apart electrical pulses provided to one or more diode lasers.

FIG. 6 is a simplified chart that illustrates another exemplary quasi-continuous laser pulse 60' from a fiber laser 102, 122 in the form of a continuous waveform that results from a plurality of temporally spaced-apart electrical pulses provided to one or more diode lasers 110A, 110B, 110C, 110D, 110E, 110F, 130A, 130B, 130C, 130D, 130E, 130F. In the implementation of FIG. 6 (as in the implementation of FIGS. 5A and 5B), one or more initial pre-pulses A provided to the diode lasers causes the emission of pump light that excites the lasing medium in a gain section 104, 124 to just below its lasing threshold. That is, at the end of the pre-pulse(s) A, while a laser pulse 60' does not yet emanate from a fiber laser 102, 122, the addition of a small amount of added energy will cause a laser pulse to be emitted. Following pre-pulse(s) A, the one or more diode lasers 110A, 110B, 110C, 110D, 110E, 110F, 130A, 130B, 130C, 130D, 130E, 130F are pumped using a relatively longer sequence of temporally spaced-apart electrical pulses B, C, D, etc. The combined light pulses emitted from the diode lasers 110A, 110B, 110C, 110D, 110E, 110F and provided to the gain section 104 and the combined light pulses from the diode lasers 130A, 130B, 130C, 130D, 130E, 130F provided to the gain section 124 can be emitted in response to the electrical pulses B, C, D, etc. that can have durations of about 50 μs and that can be spaced-apart from adjacent pulses by about 50 μs. This sequence of temporally spaced-apart electrical pulses is used to drive the one or more diode lasers 110A, 110B, 110C, 110D, 110E, 110F, 130A, 130B, 130C, 130D, 130E, 130F may be referred to herein as digitized electrical pulses or digital pumping. As a result of such optical pumping, a quasi-continuous laser pulse 60' (that comprises a series of laser pulses 60 merged to form of a continuous waveform) having a relatively long duration (e.g., about 4300 μs) that is emitted from one fiber laser 102, 122 that can be combined with light emitted from another fiber laser 102, 122 into a delivery fiber 150. This laser pulse duration is only exemplary, and the use of digitized electrical pulses having different characteristics (number, duration, spacing, etc.) is also contemplated.

As shown in FIG. 6, the duration of the electrical pulses (B, C, D, etc.), and the spacing between them, can be constant. Such an electrical pulse profile may produce a quasi-continuous laser pulse 60' having a profile having a uniform repeated pattern as illustrated in FIG. 6. However, a constant duration and spacing of electrical pulses is not a requirement, and one or all of the duration of the electrical pulses, the spacing between the electrical pulses, and the magnitude of the electrical pulses may be varied to tailor the resulting laser pulse 60' profile as desired. That is, the pattern of optical pulse pulses provided by the one or more diode lasers 110A, 110B, 110C, 110D, 110E, 110F, 130A, 130B, 130C, 130D, 130E, 130F to the lasing media in the gain sections 104, 124 can be configured to modulate (increase, decrease, etc.) the pulse width and shape of the resulting laser beam that is provided to the optical delivery fiber 150.

The amplitude of the electrical pulses may be configured to produce laser pulses 60 having different powers or energies. However, maintaining the energy and power of the pump light pulses from diode lasers 110A, 110B, 110C, 110D, 110E, 110F, 130A, 130B, 130C, 130D, 130E, 130F below pre-determined threshold values can result in increased fluorescence lifetime of the lasing medium in the gain sections 104, 124 of the fiber lasers 102, 122, less risk of damage to the fiber lasers 102, 122, reduced retropulsion of the target of the combined laser light from the fiber lasers, which is supplied in the delivery optical fiber to the target. This relatively smaller magnitude and longer duration laser pulse 60' may increase the efficiency of the laser system 100 by minimizing undesirable effects such as a retropulsion of a target by the laser light delivered to the target. The relatively smaller magnitude and longer duration quasi-continuous laser pulse 60' may be used for medical applications, such as stone dusting, where dust-sized particles of the stone are desired to be removed without blasting the stone into multiple large-sized pieces. In some implementations, the fiber laser can produce output laser powers of about 20 to 40 W, and the combined energy of the multiple lasers can be greater than 0.1 J, greater than 0.3 J, greater than 1.0 J, greater than 3.0 J, or greater than 10 J. The combined peak power from the multiple lasers can be greater than 0.1 kW, greater than 0.3 kW, greater than 1.0 kW, greater than 2.1 kW, which can cover both low peak power for reduced retropulsion and have the capability of breaking hard human stones with high peak powers.

In some implementations, the controller 135 of the laser system 100 may determine a suitable pattern of electrical pulses based on a user-desired laser pulse profile and may cause the power supplies 114, 134 to direct these electrical pulses to the diode lasers 110A, 110B, 110C, 110D, 110E, 110F, 130A, 130B, 130C, 130D, 130E, 130F. In response to pulses of pump light energy received from the diode lasers, the fiber lasers 102, 122 may output pulses that are combined to form a quasi-continuous laser pulse 60' having desired pulse profile.

Detailed implementations are disclosed herein. However, it is understood that the disclosed implementations are merely examples, which may be embodied in various forms. Therefore, specific structural and functional details disclosed herein are not to be interpreted as limiting but merely as a basis for the claims and as a representative basis for teaching one skilled in the art to variously employ the implementations in virtually any appropriately detailed structure. Further, the terms and phrases used herein are not intended to be limiting but to provide an understandable description of the present disclosure.

The terms “a” or “an,” as used herein, are defined as one or more than one. The term “another,” as used herein, is defined as at least a second or more. The terms “including” and/or “having,” as used herein, are defined as comprising (i.e., open transition). The term “coupled” or “movably coupled,” as used herein, is defined as connected, although not necessarily directly and mechanically.

In general, the implementations are directed to systems and techniques for performing medical procedures. The term patient or user may hereafter be used for a person who benefits from the medical system or the methods disclosed in the present disclosure. For example, the patient can be a person into whose body a component of the medical system is inserted or on whose body the methods disclosed for operating the medical system are used. For example, in some implementations, the patient may be a human being.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations.

What is claimed is:

1. A laser system, comprising:

a plurality of fiber laser amplifiers;

a beam combiner configured to combine laser light outputs from the plurality of fiber laser amplifiers;

an optical delivery fiber configured to receive the combined output from the plurality of laser amplifiers into the delivery fiber and configured to deliver the combined output to a target;

a plurality of diode lasers configured for providing optical pump pulses to the plurality of fiber laser amplifiers, wherein the laser light outputs from the plurality of fiber laser amplifiers are generated in response to the provided optical pump pulses; and one or more power supplies configured to provide a plurality of temporally spaced-apart electrical pulses to the plurality of diode lasers, wherein the plurality of diode lasers are configured to emit laser light pulses in response to the provided electrical pulses, wherein the plurality of temporally spaced-apart electrical pulses include: one or more first electrical pulses configured to cause at least one of the plurality of diode lasers to emit one or more first laser light pulses, and a plurality of second electrical pulses following the one or more first electrical pulses configured to cause the plurality of diode lasers to emit second laser light pulses, wherein the one or more first laser light pulses excite a lasing medium of gain sections of the plurality of fiber laser amplifiers to an energy level below a lasing threshold of the lasing medium, wherein the plurality of second laser light pulses excite the lasing medium to an energy level above a lasing threshold of the lasing medium, wherein the plurality of fiber laser amplifiers are configured to output a quasi-continuous laser pulse in response to the plurality of second laser light pulses, and wherein a laser pulse duration of the quasi-continuous laser pulses is between 250 us to 10 ms.

2. The laser system of claim 1, wherein the fiber laser amplifiers each include a Tm-doped gain section.

3. The laser system of claim 1, wherein each of the plurality of diode lasers is configured to generate optical pump pulses, the laser system further comprising:

a first pump combiner configured for combining the generated optical pump pulses from a first set of the plurality of diode lasers into a first optical fiber that provides the combined optical pump pulses from the first set of diode lasers to a gain section of a first one of the fiber laser amplifiers; and a second pump combiner configured for combining the generated optical pump pulses from a second set of the plurality of diode lasers into a second optical fiber that provides the combined optical pump pulses from the second set of diode lasers to a gain section of a second one of the fiber laser amplifiers.

4. The laser system of claim 3, wherein each of the first and second pump combiners include a plurality of pigtailed optical fibers that are tapered into a single multi-mode optical fiber, each of the pigtailed optical fibers being configured for receiving light pulses from one of the plurality of diode lasers and providing the received light pulses into the single multi-mode optical fiber.

5. The laser system of claim 1, wherein the combined laser output delivered to the target has a power of greater than 1.0 kW and wherein the laser output delivered to the target has a wavelength between 1925 nm and 2100 nm.

6. The system of claim 1, wherein each temporally spaced-apart electrical pulse has a duration in a range of 10 μs to 1000 μs.

7. The system of claim 1, wherein a spacing between adjacent the temporally spaced-apart electrical pulses is between 10-300 μs.

8. The system of claim 1, wherein the quasi-continuous laser pulses include a plurality of temporally spaced apart laser pulses having a frequency greater than or equal to 1 kHz.

9. A laser system, comprising:

a plurality of fiber laser amplifiers;

a beam combiner configured to combine laser light outputs from the plurality of fiber laser amplifiers;

an optical delivery fiber configured to receive the combined output from the plurality of laser amplifiers into the delivery fiber and configured to deliver the combined output to a target;

a master oscillator configured for providing optical seed pulses to the plurality of fiber laser amplifiers, wherein the laser light outputs from the plurality of fiber laser amplifiers are generated in response to the provided optical seed pulses; and one or more power supplies configured to provide a plurality of temporally spaced-apart electrical pulses to the master oscillator, wherein the master oscillator is configured to emit the optical seed pulses in response to the provided temporally spaced-apart electrical pulses, wherein the plurality of temporally spaced-apart electrical pulses include: one or more first electrical pulses configured to cause the master oscillator to emit laser light pulses provided to gain sections of the fiber laser amplifiers to excite a lasing medium of the gain sections to an energy level below a lasing threshold of the lasing medium, and a plurality of second electrical pulses following the one or more first electrical pulses configured to cause the master oscillator to emit laser light pulses provided to the gain sections of the fiber laser amplifiers to excite the lasing medium of the gain sections to an energy level above a lasing threshold of the lasing medium, wherein each fiber laser amplifier is configured to output a quasi-continuous laser pulse in response to the plurality of second electrical pulses provided to the master oscillator, and wherein a laser pulse duration of the quasi-continuous laser pulses is between 250 μs to 10 ms.

10. The laser system of claim 9, wherein the fiber laser amplifiers each include a Tm-doped gain section, wherein the combined laser output delivered to the target has a power of greater than 1.0 kW, and wherein the laser output delivered to the target has a wavelength between 1925 nm and 2100 nm.

11. The laser system of claim 9, further comprising:

a beam splitter configured to split an output of optical pump pulses from the master oscillator into different optical fibers configured to provide the optical pump pulses to different fiber laser amplifiers of the plurality of fiber laser amplifiers.

12. The laser system of claim 9, wherein the master oscillator includes a diode laser.

13. The laser system of claim 9, wherein each temporally spaced-apart electrical pulse has a duration in a range of 10 μs to 1000 μs.

14. The laser system of claim 9, wherein a spacing between adjacent the temporally spaced-apart electrical pulses is between 10-300 μs.

15. The laser system of claim 9, wherein the quasi-continuous laser pulses include a plurality of temporally spaced apart laser pulses having a frequency greater than or equal to 1 kHz.

16. The laser system of claim 9, wherein the plurality of fiber laser amplifiers includes at least four fiber laser amplifiers.

* * * * *